US009958475B2

(12) United States Patent
Wang et al.

(10) Patent No.: US 9,958,475 B2
(45) Date of Patent: May 1, 2018

(54) TEST DEVICE AND TEST METHOD USING THE SAME

(71) Applicants: BOE TECHNOLOGY GROUP CO., LTD., Beijing (CN); BOE (HEBEI) MOBILE DISPLAY TECHNOLOGY CO., LTD., Hebei (CN)

(72) Inventors: Guiyun Wang, Beijing (CN); Xuefeng Li, Beijing (CN)

(73) Assignees: BOE TECHNOLOGY GROUP CO., LTD. (CN); BOE (HEBEI) MOBILE DISPLAY TECHNOLOGY CO., LTD. (CN)

( * ) Notice: Subject to any disclaimer, the term of this patent is extended or adjusted under 35 U.S.C. 154(b) by 38 days.

(21) Appl. No.: 15/308,108

(22) PCT Filed: Feb. 25, 2016

(86) PCT No.: PCT/CN2016/074508
§ 371 (c)(1),
(2) Date: Nov. 1, 2016

(87) PCT Pub. No.: WO2017/041449
PCT Pub. Date: Mar. 16, 2017

(65) Prior Publication Data
US 2017/0269124 A1    Sep. 21, 2017

(30) Foreign Application Priority Data
Sep. 7, 2015  (CN) .......................... 2015 1 0562926

(51) Int. Cl.
*G01R 31/00* (2006.01)
*G01R 1/04* (2006.01)
(Continued)

(52) U.S. Cl.
CPC ......... *G01R 1/0408* (2013.01); *G01R 1/0433* (2013.01); *G01R 1/0483* (2013.01);
(Continued)

(58) Field of Classification Search
CPC .. G01R 1/0408; G01R 1/0433; G01R 1/0483; G01R 1/07314; G01R 31/26;
(Continued)

(56) References Cited

U.S. PATENT DOCUMENTS

2013/0069884 A1\* 3/2013 Cheng ..................... G06F 3/041
345/173
2014/0203816 A1 7/2014 Li et al.
(Continued)

FOREIGN PATENT DOCUMENTS

CN        201876508 U    6/2011
CN        103941109 A    7/2014
(Continued)

OTHER PUBLICATIONS

First Office Action for Chinese Application No. 201510562926.4, dated Jul. 26, 2017, 6 Pages.
(Continued)

*Primary Examiner* — Jermele M Hollington
*Assistant Examiner* — Raul Rios Russo
(74) *Attorney, Agent, or Firm* — Brooks Kushman P.C.

(57) ABSTRACT

The present disclosure provides a test device and a test method using the test device. The test device includes a first fastener structure for fastening a to-be-tested substrate with first touch lines, a second fastener structure for fastening a test match panel with second touch lines, and the first touch lines and the second touch lines forming a touch module, a third fastener structure for supporting a change-over flexible printed circuit board, a signal input structure for electrically connecting to one of a circuit board in the test match panel
(Continued)

and the first touch lines through the change-over flexible printed circuit board, and inputting trigger data signals, a sensing signal capture structure for capturing touch sensing signals in the first touch line or the second touch lines.

13 Claims, 2 Drawing Sheets

(51) Int. Cl.
    *G06F 3/041*     (2006.01)
    *G06F 3/044*     (2006.01)
    *G01R 1/073*     (2006.01)
    *G01R 31/26*     (2014.01)
    *G01R 31/28*     (2006.01)

(52) U.S. Cl.
    CPC .......... *G01R 1/07314* (2013.01); *G01R 31/26* (2013.01); *G06F 3/044* (2013.01); *G06F 3/0416* (2013.01); *G01R 31/2808* (2013.01)

(58) Field of Classification Search
    CPC ............ G01R 31/2808; G01R 31/2886; G01R 3/0416; G01R 3/044
    USPC ..... 324/71, 378, 403, 415, 425, 500, 756.01
    See application file for complete search history.

(56) References Cited

U.S. PATENT DOCUMENTS

2014/0368752 A1* 12/2014 Wu ................... G02F 1/13338
    349/12
2015/0092120 A1* 4/2015 Wang ..................... G06F 3/041
    349/12

FOREIGN PATENT DOCUMENTS

| CN | 103969538 A | 8/2014 |
|---|---|---|
| CN | 105183225 A | 12/2015 |

OTHER PUBLICATIONS

International Search Report and Written Opinion for Application No. PCT/CN2016/074508, dated Jun. 14, 2016, 9 Pages.
1st Chinese Office Action.
International Search Report and Written Opinion.

* cited by examiner

TEST DEVICE AND TEST METHOD USING THE SAME

CROSS-REFERENCE TO RELATED APPLICATIONS

This application is the U.S. national phase of PCT Application No. PCT/CN2016/074508 filed on Feb. 25, 2016, which claims priority to Chinese Patent Application No. 201510562926.4 filed on Sep. 7, 2015, the disclosures of which are incorporated in their entirety by reference herein.

TECHNICAL FIELD

The present disclosure relates to the technical field of manufacturing display devices, and specifically relates to a test device and a test method using the test device.

BACKGROUND

In a typical touch display device, a touch sensor structure for a touch sensing operation is arranged on a cover (such as an OGS product) of a touch screen and a surface (such as an on-cell product) with a color filter of a display panel, and a corresponding capacitance transmitting terminal Tx and a corresponding capacitance receiving terminal Rx for the touch sensing operation are connected to a touch chip (Touch IC) by the same flexible printed circuit (FPC) board. Thus, there is no coupling between a touch sensing detection and product display signals, and the touch sensing detection may be performed directly by means of ordinary jigs.

However, for hybrid in-cell (HIC) display products, as shown in FIG. 1, the Rx for the touch sensing operation is arranged on a surface of a color filter (CF) substrate 1 of a display panel, and the Tx and the Vcom signal line in display lines of a TFT array substrate 2 are multiplexed. As for finished hybrid in-cell products, as shown in FIG. 1, the touch flexible printed circuit (Touch FPC) board 3 on the CF substrate 1 is electrically connected to a main flexible printed circuit board 4 on the TFT substrate 2. Display chips are arranged on the main flexible printed circuit board 4, and touch chips are arranged on the touch flexible printed circuit board 3. The display chips and the touch chips are used to perform image display operations and touch sensing operations, respectively.

However, in a CELL stage of a manufacture process of a display device, since Tx signals cannot be transmitted through the display chips before assembling the CF substrate 1 and the TFT substrate 2, thus, the touch sensing detection may not be performed though traditional methods.

SUMMARY

One object of the present disclosure is to provide a test device and a test method using the test device, which can implement touch sensing detection to touch lines before finishing assembly for a display product.

The present disclosure provides a test device which includes: a first fastener structure for fastening a to-be-tested substrate with first touch lines; a second fastener structure for fastening a test match panel with second touch lines; by means of the first fastener structure and the second fastener structure, the to-be-tested substrate and the test match panel being arranged opposite to each other with a touch module defined by the first touch lines and the second touch lines; a third fastener structure for supporting a change-over flexible printed circuit board; a signal input structure for electrically connecting to one of a circuit board in the test match panel and the first touch lines through the change-over flexible printed circuit board, and inputting trigger data signals; a sensing signal capture structure for electrically connecting to the other one of the circuit board in the test match panel and the first touch lines through the change-over flexible printed circuit board, and capturing touch sensing signals from one of the first touch lines and the second touch lines on the test match panel, which is electrically connected with the sensing signal capture structure.

Optionally, in the above test device, the first fastener structure includes a horizontal support surface; the horizontal support surface includes a plurality of positioning points for positioning horizontally the to-be-tested substrate.

Optionally, in the above test device, the second fastener structure is pivotally connected to the first fastener structure; the second fastener structure has a state in which the second fastener structure is rotated away the first fastener structure so that the test match panel is moved away from the to-be-tested substrate, and a state in which the second fastener structure is engaged with the first fastener structure so that the to-be-tested substrate is arranged opposite with respect to the test match panel.

Optionally, in the above test device, the change-over flexible printed circuit board includes a fixed board body and a movable first joint; and the first joint is operable between an attached state and a detached state with the first touch lines.

Optionally, in the above test device, the board body of the change-over flexible printed circuit board is provided with a touch chip, a second joint for joining to the circuit board of the test match panel, a third joint for joining to the signal input structure, and a fourth joint for joining to the sensing signal capture structure; the touch chip is connected to the first joint, the second joint and the fourth joint, and the second joint is connected to the third joint.

Optionally, in the above test device, the third fastener structure includes a fixed portion and a movable portion which is arranged on the fixed portion and movable relative to the fixed portion; the board body of the change-over flexible printed circuit board is horizontally arranged on the fixed portion, and the first joint is arranged on the movable portion; the first joint is attached to or detached from the first touch lines by moving the movable portion relative to the fixed portion.

Optionally, in the above test device, the third fastener structure further includes a driving portion on the fixed portion; the driving portion is connected to the movable portion and used to drive the movable portion to move so that the first joint operates between the attached state and the detached state with the first touch lines.

Optionally, in the above test device, vertical sliding rails are arranged on the fixed portion, and sliding grooves matching with the sliding rails are arranged in the movable portion; by engagement between the sliding grooves and the sliding rails, the movable portion is slidable upwards and downwards relative to the fixed portion.

Optionally, in the above test device, the driving portion includes a press bar and a transmission mechanism jointed to the press bar; the transmission mechanism is joined to the movable portion; the press bar drives the transmission structure to operate so that the movable portion moves relative to the fixed portion.

Optionally, in the above test device, the to-be-tested substrate is a first color filter substrate, and the first touch lines are on the first color filter substrate; the test match panel includes an array substrate, and common electrode lines on the array substrate form the second touch lines.

Optionally, in the above test device, the test match panel further includes a second color filter substrate assembled with the array substrate.

Optionally, in the above test device, the test match panel further includes a circuit board connected to the array substrate and a display chip arranged on the circuit board.

The present disclosure also provides a test method using the above test device. The test method includes: fastening a to-be-tested substrate on the first fastener structure; fastening a test match panel on the second fastener structure, and causing the to-be-tested substrate to be opposite with respect to the test match panel; electrically connecting the signal input structure and the sensing signal capture structure to the change-over flexible printed circuit board; joining the change-over printed circuit board to the to-be-tested substrate and the test match panel; causing the signal input structure to input trigger data signals to one of the test match panel and the to-be-tested substrate, so that after the one of the test match panel and the to-be-tested substrate receives the trigger data signals, the sensing signal capture structure captures touch sensing signals on the other of the test match panel and the to-be-tested substrate with the effect of the trigger data signals.

At least one of the embodiments of the present disclosure has the following advantages.

When the to-be-tested substrate only includes touch lines for transmitting signals or only includes touch lines for receiving signals, by assembling the test match panel with the to-be-tested substrate and utilizing the change-over flexible printed circuit board, line detection for the touch lines on the to-be-tested substrate may be implemented, and effective detection for line unhealthiness of the touch lines may be achieved.

DETAILED DESCRIPTION

Figure 1:
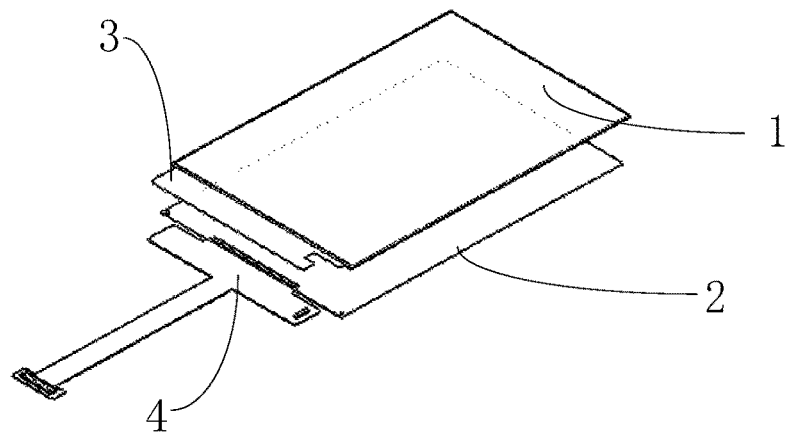
FIG. 1 is a schematic diagram of a display module of a hybrid in-cell product in related arts.

To make technical problems to be solved, technical solutions, and advantages of the embodiments of the present disclosure more clear, specific embodiments will be described hereinafter in detail in combination with the drawings.

The test device according to the embodiments of the present disclosure includes:

a first fastener structure for fastening a to-be-tested substrate provided with first touch lines;

a second fastener structure for fastening a test match panel provided with second touch lines; by means of the first fastener structure and the second fastener structure, the to-be-tested substrate and the test match panel being arranged opposite to each other with a touch module defined by the first touch lines and the second touch lines;

a third fastener structure for supporting a change-over flexible printed circuit board;

a signal input structure for electrically connecting to one of a circuit board of the test match panel and the first touch lines through the change-over flexible printed circuit board, and inputting trigger data signals; and a sensing signal capture structure for electrically connecting to the other one of the circuit board of the test match panel and the first touch lines through the change-over flexible printed circuit board, and capturing touch sensing signals from one of the first touch lines or the second touch lines in the test match panel, which is electrically connected with the sensing signal capture structure.

In the above test device of the present disclosure, when the test match panel and the to-be-tested substrate are assembled, the first touch lines in the to-be-tested substrate and the second touch lines in the test match panel define the touch module for the touch sensing operation. Further, inputting test signals and capturing touch signals for the touch module are implemented through a change-over function of the change-over flexible printed circuit board. Therefore, when the to-be-tested substrate only includes touch lines for transmitting signals or only includes touch lines for receiving signals, by assembling the to-be-tested substrate with the test match panel and utilizing the change-over flexible printed circuit board, line detection for the touch lines on the to-be-tested substrate may be implemented, and effective detection for line unhealthiness of the touch lines may be achieved, thereby preventing unhealthy substrate from going through the next process and achieving effects of reducing additional material loss and product costs.

Those skilled in the art should understand that, in the process of manufacturing the hybrid in-cell display products, at a cell stage, before assembling the CF substrate with the TFT substrate, lines on the CF substrate and the TFT substrate need to be detected. The above test device provided by the embodiments of the present disclosure may be used to test touch signal reception lines on the CF substrate, and the touch signal transmission lines on the TFT substrate (i.e., common signal lines in the display lines).

Thus, the to-be-tested substrate may be the CF substrate or the TFT substrate.

A specific structure of the test device provided in the present disclosure will be detailed hereinafter with an example in which the test device provided in the present disclosure is applied to test the touch signal reception lines on the CF substrate.

Figure 2:
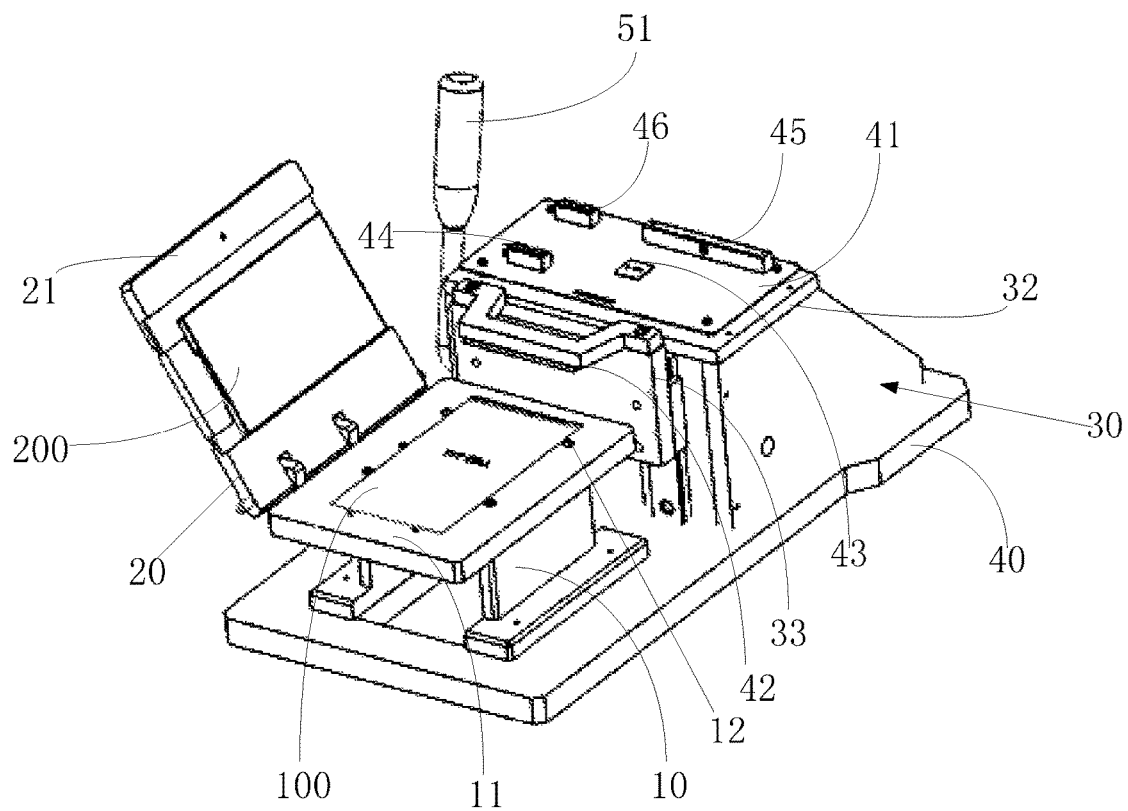
FIG. 2 is a schematic diagram of a test device in embodiments of the present disclosure.

Referring to FIG. 2, FIG. 2 is a schematic diagram of a test device provided in embodiments of the present disclosure. As shown in FIG. 2, the test device includes:

a first fastener structure 10 including a horizontal support surface 11 which is provided with a plurality of positioning points 12 for positioning horizontally a to-be-tested CF substrate 100 on the horizontal support surface 11; and a second fastener structure 20 for fastening a test match panel 200.

In the present embodiment, the second fastener structure 20 is pivotably connected to the first fastener structure 20, and has a state in which the second fastener structure 20 is rotated away from the first fastener structure 10 so that the test match panel 200 is moved away from the to-be-tested CF substrate 100, and a state in which the second fastener structure 20 is engaged with the first fastener structure 10 so that the to-be-tested CF substrate 100 is arranged opposite with respect to the test match panel 200. Additionally, the second fastener structure 20 includes a support surface 21 for positioning the test match panel 200. A positioning structure is arranged on the support surface 21 to position and fasten the test match panel 200.

By using the first fastener structure 10 and the second fastener structure 20, when the second fastener structure 20 is rotated away from the first fastener structure 10 to an open state, the to-be-tested CF substrate 100 is arranged on the first fastener structure 10 and positioned by the positioning points 12. Meanwhile, the test match panel 200 is positioned on the support surface 21 of the second fastener structure 20 and secured by the positioning structure. Then, the second fastener structure 20 is rotated towards a side of the first fastener structure 10 to cover the horizontal support surface 11 of the first fastener structure 10. Then, the to-be-tested CF substrate 100 and the test match panel 200 are just in an assembled state as being assembled in one display panel.

It should be understood by those skilled in the art that, specific structures arranged on the first fastener structure 10 and the second fastener structure 20 and used for fastening and positioning the CF structure under test 100 and the test match panel 200, are not described in detail herein since they are not important contents of the present disclosure.

Further, as shown in FIG. 2, the test device according to embodiments of the present disclosure further includes a third fastener structure 30 for supporting a change-over flexible printed circuit board.

In addition, the first fastener structure 10, the second fastener structure 20 and the third fastener structure 30 are arranged on a support base 40 which is used to assemble the three fastener structures 10, 20 and 30 together and separate the third fastener structure 30 from the first fastener structure 10 by a predetermined distance.

In the embodiments of the present disclosure, the change-over flexible printed circuit board includes a board body 41 and a first joint 42 movable relative to the board body 41. The first joint 42 is arranged on a side of the board body 41 close to the first fastener structure 10. With a movable function, the first joint 42 may be attached to connection terminals of the first touch lines in the to-be-tested CF substrate 100, and may be detached from a connected state with the connection terminals of the first touch lines, and work between an attached state with the connection terminals of the first touch lines and the detached state with the connection terminals of the first touch lines.

In order to achieve the above movable function of the first joint 42, referring to FIG. 2, the third fastener structure 30 includes a fixed portion 32 and a movable portion 33 which is arranged on the fixed portion 32 and movable relative to the fixed portion 32. The board body 41 of the change-over flexible printed circuit board is horizontally arranged on the fixed portion 32. The first joint 42 is arranged on the movable portion 33. By moving the movable portion 33 relative to the fixed portion 32, the first joint 42 is attached to or detached from the connection terminals of the first touch lines in the to-be-tested CF substrate 100.

The third fastener structure 30 further includes a driving portion arranged on the fixed portion 32 and joined to the movable portion 33. The driving portion is used to drive the movable portion 33 to move so that the first joint 42 works between the attached state and the detached state with the connection terminals of the first touch lines. As shown in FIG. 2, vertical sliding rails are arranged on the fixed portion 32, and sliding grooves matching with the sliding rails are arranged on the movable portion 33. By engagement between the sliding grooves and the sliding rails, the movable portion 33 may slide upwards and downwards relative to the fixed portion 32.

Specifically, the driving portion includes a press bar 51 and a transmission mechanism joined to the press bar 51. The transmission mechanism is arranged inside the fixed portion 32 and is joined to the movable portion 33. Specifically, the press bar 51 may rotate relative to the fixed portion 32 around a junction between the press bar 51 and the fixed portion 32. The rotation of the press bar 51 drives the transmission mechanism to work, and meanwhile, the transmission mechanism causes the movable portion 33 to move. Because the movable portion 33 may move upwards and downwards relative to the fixed portion 32, thus, the first joint 42 on the movable portion 33 is caused to move upwards and downwards. Specifically, an operational mode in which the press bar 51 drives the movable portion 33 may be the following: when the press bar 51 rotates from a vertical state shown in FIG. 2 in a clockwise direction, the movable portion 33 is caused to move downwards; and when the press bar 51 rotates from a horizontal state in a counterclockwise direction, the movable portion 33 is caused to move upwards. For example, the transmission mechanism may include a driving shaft and a gear set arranged on the driving shaft. By means of transmission between the driving shaft and the gear set, the rotation of the press bar 51 leads the movable portion 33 to move upwards and downwards. Those skilled in the art should understand that there are multiple transmission mechanisms by which the rotation of the press bar 51 may cause the movable portion 33 to move, and they will not be repeated in detail herein.

Figure 3:
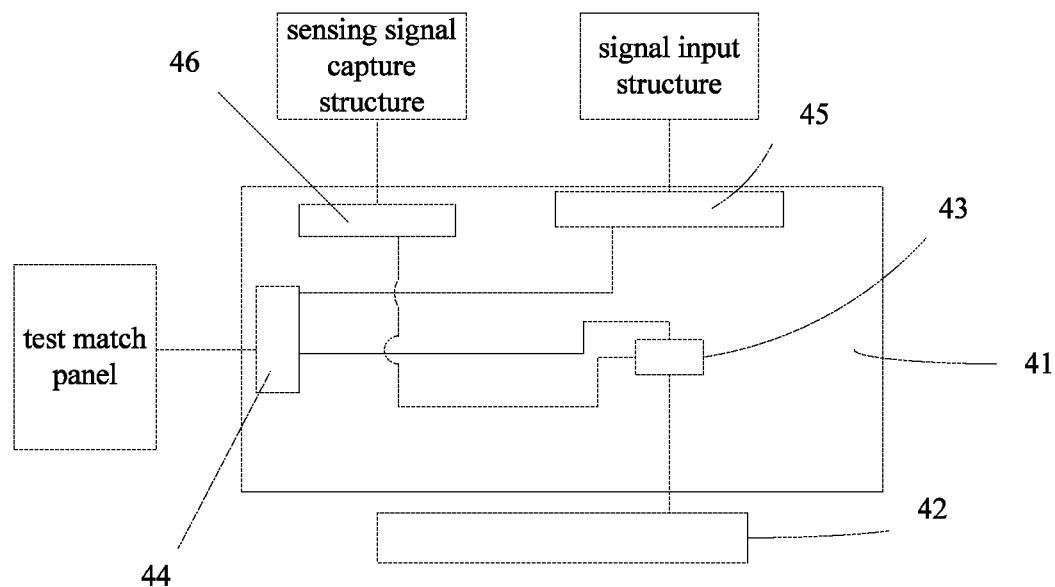
FIG. 3 is a schematic diagram of circuit connections of a change-over flexible printed circuit board in the test device in the embodiments of the present disclosure.

In the embodiments of the present disclosure, as shown in FIG. 2 and FIG. 3, the change-over flexible printed circuit board further includes a touch chip 43, a second joint 44 for connecting to a circuit board of the test match panel 200, a third joint 45 for connecting to a signal input structure, and a fourth joint 46 for connecting to a sensing signal capture structure. The touch chip 43 is connected to the first joint 41, the second joint 44, and the fourth joint 46, and the second joint 44 is connected to the third joint 45.

The above touch chip 43, the second joint 44, the third joint 45, the fourth joint 46 are fixed onto the board body 41 of the change-over flexible printed circuit board.

In addition, the above signal input structure is specifically used to input to the test match panel 200 voltages and signals for which a normal operation of the test match panel 200 requires. The sensing signal capture structure (which includes a touch sensing test box and a test apparatus installed with PC-specific test software) is used to capture touch sensing signals on the touch chip 43, analyze the captured touch sensing signals, detect voltage conditions on the Rx lines, and determines connection conditions on the Rx lines.

Figure 4:
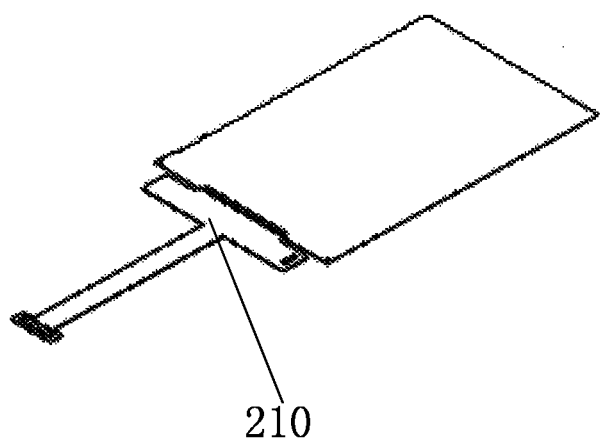
FIG. 4 is a schematic diagram of one implementation of a test match panel in the test device in the embodiments of the present disclosure.

When the test device provided by the embodiments of the present disclosure is used to test the Rx lines on the to-be-tested CF substrate 100, the test match panel 200 may be a TFT substrate including the structure shown in FIG. 4. Common electrode lines on the TFT substrate form the Tx lines corresponding to the Rx lines on the to-be-tested CF substrate 100. In order to meet test requirements, the TFT substrate is further connected with a main FPC 210 provided with display chips.

In another embodiment, the test match panel 200 may also be used to form the hybrid in-cell display module product including the structure shown in FIG. 1, which includes the CF substrate 1, the TFT substrate 2 and the main FPC 4 connected with the TFT substrate 2. Display chips are arranged on the main FPC 4. The common electrode lines on the TFT substrate 2 form the Tx lines corresponding to the Rx lines on the to-be-tested CF substrate 100.

Referring to FIG. 1 to FIG. 4, a test process performed using the above test device is as follows: fastening the to-be-tested CF substrate 100 onto the first fastener structure 10; fastening the test match panel 200 in the form shown in FIG. 1 or FIG. 4 onto the second fastener structure 20, rotating the second fastener structure 20 to cause the second fastener structure 20 to cover the first fastener structure 10 and cause the to-be-tested CF substrate 100 to be opposite arranged with respect to the test match panel 20; joining the signal input structure to the third joint 45; joining the sensing signal capture structure to the fourth joint 46; joining the main FPC of the test match panel 200 to the second joint 44, and joining the sensing signal capture structure to the fourth joint 46; inputting voltage and display signals to the test match panel 200 through the signal input structure; rotating the vertically arranged press bar 51 downwards in a clockwise direction, so that the press bar 51 drives the movable portion 33 to move downwards, i.e., drives the first joint 42 arranged on the movable portion 33 to move downwards, and that the first joint 42 is connected to a metal connection terminal for the Rx lines on the to-be-tested CF substrate 100 and that the Rx lines on the to-be-tested CF substrate 100 are connected to the sensing signal capture structure through the fourth joint 46, the touch chip 43 on the change-over flexible printed circuit board, and the first joint 42.

With the above arrangement, when the press bar 51 rotates to cause the first joint 42 to be jointed to the metal connection terminal for the Rx lines in the to-be-tested CF substrate 100, display signals received by the test match panel 200 are synchronized to the touch chip 43, so that the Rx lines on the to-be-tested CF substrate 100 receive touch signals transmitted by the Txs in the test match panel 200 which, after being processed by the touch chip 43, are fed back to the sensing signal capture structure through the fourth joint 46 to perform sensing signal processing and judgment operations, thereby implementing detection to the Rx lines on the to-be-tested CF substrate 100.

It may be understood that, the above test device provided in the embodiments of the present disclosure is not limited to be applied to detection to the Rx lines in the CF substrate in the finished hybrid in-cell products. Based on the same principle, if the Tx lines on the TFT substrate used for touch operations are not provided with other detection devices, using the test device of the present disclosure may also implement the detection thereof. That is, the TFT substrate as the to-be-tested substrate is positioned on the first fastener structure, and a test match panel including the CF substrate (which may only include the CF substrate, or be the finished hybrid in-cell product) is fastened on the second fastener structure. When data or voltage signals for test are inputted to the Tx lines on the TFT substrate through the change-over flexible printed circuit board, by capturing and reasonably judging the touch sensing signals on the Rx lines in the CF substrate which functions as the test match panel, signal transmission conditions of the Tx lines on the TFT substrate may be detected and unhealthy lines may be found.

In another aspect of the embodiments of the present disclosure, a test method using the above test device is also provided, the test method includes:

fastening the to-be-tested substrate on the first fastener structure;

fastening the test match panel on the second fastener structure, and causing the to-be-tested substrate and the test match panel to be arranged opposite to each other;

electrically joining the signal input structure and the sensing signal capture structure to the change-over flexible printed circuit board;

joining the change-over printed circuit board to the to-be-tested substrate and the test match panel; and causing the signal input structure to input trigger data signals to one of the test match panel and the to-be-tested substrate so that after the one of the test match panel and the to-be-tested substrate receives the trigger data signals, the sensing signal capture structure captures the touch sensing signals on the other of the test match panel and the to-be-tested substrate with the effects of the trigger data signals.

The test device and the test method provided in the embodiments of the present disclosure, by assembling with the test match panel and utilizing the change-over flexible printed circuit board, may be used for line detection to the touch lines on the to-be-tested substrate and implement effective detection for unhealthy lines of the touch lines. Specifically, in the process of manufacturing the hybrid in-cell display products, the test device and the test method may be used to test the touch signal reception lines on the CF substrate at the cell stage and may be used to test the touch signal transmission lines (i.e., the common signal lines in the display lines) on the TFT substrate, thereby preventing unhealthy substrate from going through the next process and achieving effects of reducing additional material loss and product costs.

The above are only alternative embodiments of the present disclosure. It should be pointed out that numerous modifications and embellishments can be done by one skilled in the art without departing the spirit of the present disclosure. Such modifications and embellishments should also be considered to be within the protection scope of the present disclosure.

What is claimed is:

1. A test device, comprising:
   a first fastener structure for fastening a to-be-tested substrate with first touch lines;
   a second fastener structure for fastening a test match panel with second touch lines; wherein by means of the first fastener structure and the second fastener structure, the to-be-tested substrate and the test match panel are arranged opposite to each other with a touch module defined by the first touch lines and the second touch lines;
   a third fastener structure for supporting a change-over flexible printed circuit board;
   a signal input structure for electrically connecting to one of a circuit board in the test match panel and the first touch lines through the change-over flexible printed circuit board, and inputting trigger data signals;
   a sensing signal capture structure for electrically connecting to the other one of the circuit board in the test match panel and the first touch lines through the change-over flexible printed circuit board, and capturing touch sensing signals from one of the first touch lines and the second touch lines on the test match panel, which is electrically connected with the sensing signal capture structure.

2. The test device according to claim 1, wherein the first fastener structure comprises a horizontal support surface; the horizontal support surface comprises a plurality of positioning points for positioning horizontally the to-be-tested substrate.

3. The test device according to claim 1, wherein the second fastener structure is pivotally connected to the first fastener structure; the second fastener structure has a state in which the second fastener structure is rotated away the first fastener structure so that the test match panel is moved away from the to-be-tested substrate, and a state in which the second fastener structure is engaged with the first fastener structure so that the to-be-tested substrate is arranged opposite with respect to the test match panel.

4. The test device according to claim 1, wherein the change-over flexible printed circuit board comprises a fixed board body and a movable first joint; and the first joint is operable between an attached state and a detached state with the first touch lines.

5. The test device according to claim 4, wherein the board body of the change-over flexible printed circuit board is provided with a touch chip, a second joint for joining to the circuit board of the test match panel, a third joint for joining to the signal input structure, and a fourth joint for joining to the sensing signal capture structure; the touch chip is connected to the first joint, the second joint and the fourth joint, and the second joint is connected to the third joint.

6. The test device according to claim 4, wherein the third fastener structure comprises a fixed portion and a movable portion which is arranged on the fixed portion and movable relative to the fixed portion; the board body of the change-over flexible printed circuit board is horizontally arranged on the fixed portion, and the first joint is arranged on the movable portion; the first joint is attached to or detached from the first touch lines by moving the movable portion relative to the fixed portion.

7. The test device according to claim 6, wherein the third fastener structure further comprises a driving portion on the fixed portion; the driving portion is connected to the movable portion and used to drive the movable portion to move so that the first joint operates between the attached state and the detached state with the first touch lines.

8. The test device according to claim 6, wherein vertical sliding rails are arranged on the fixed portion, and sliding grooves matching with the sliding rails are arranged in the movable portion; by engagement between the sliding grooves and the sliding rails, the movable portion is slidable upwards and downwards relative to the fixed portion.

9. The test device according to claim 7, wherein the driving portion comprises a press bar and a transmission mechanism jointed to the press bar; the transmission mechanism is joined to the movable portion; the press bar drives the transmission structure to operate so that the movable portion moves relative to the fixed portion.

10. The test device according to claim 1, wherein the to-be-tested substrate is a first color filter substrate, and the first touch lines are on the first color filter substrate; the test match panel comprises an array substrate, and common electrode lines on the array substrate form the second touch lines.

11. The test device according to claim 10, wherein the test match panel further comprises a second color filter substrate assembled with the array substrate.

12. The test device according to claim 10, wherein the test match panel further comprises a circuit board connected to the array substrate and a display chip arranged on the circuit board.

13. A test method using the test device according to claim 1, comprising:
fastening a to-be-tested substrate on the first fastener structure;
fastening a test match panel on the second fastener structure, and causing the to-be-tested substrate to be opposite with respect to the test match panel;
electrically connecting the signal input structure and the sensing signal capture structure to the change-over flexible printed circuit board;
joining the change-over printed circuit board to the to-be-tested substrate and the test match panel;
causing the signal input structure to input trigger data signals to one of the test match panel and the to-be-tested substrate, so that after the one of the test match panel and the to-be-tested substrate receives the trigger data signals, the sensing signal capture structure captures touch sensing signals on the other of the test match panel and the to-be-tested substrate with the effect of the trigger data signals.

* * * * *